United States Patent [19]

Irving

[11] 4,435,497
[45] Mar. 6, 1984

[54] CARBOXYL-CONTAINING COMPOSITIONS AND THEIR POLYMERIZATION

[75] Inventor: Edward Irving, Burwell, England

[73] Assignee: Ciba-Geigy Corporation, Ardsley, N.Y.

[21] Appl. No.: 385,601

[22] Filed: Jun. 7, 1982

[30] Foreign Application Priority Data

Jun. 19, 1981 [GB] United Kingdom ............... 8119036
Mar. 24, 1982 [GB] United Kingdom ............... 8208667

[51] Int. Cl.³ ................... G03C 1/68; C08F 2/46; C08F 4/00; C08G 75/04
[52] U.S. Cl. ................ 430/288; 204/159.22; 204/159.24; 525/451; 525/535; 525/921; 528/375; 528/376
[58] Field of Search ............... 430/288; 204/159.22, 204/159.24; 525/451, 535, 921; 528/375, 376; 427/54.1

[56] References Cited

U.S. PATENT DOCUMENTS

| | | | |
|---|---|---|---|
| 3,615,450 | 10/1971 | Werber et al. | 96/35 |
| 3,996,121 | 12/1976 | Greer et al. | 204/159 |
| 4,079,183 | 3/1978 | Green | 560/52 |
| 4,120,721 | 10/1978 | Ketley et al. | 96/36.3 |
| 4,132,812 | 1/1979 | Mathias | 427/44 |
| 4,140,703 | 2/1979 | Darms et al. | 260/346.3 |
| 4,177,122 | 12/1979 | Sato | 204/159 |
| 4,179,577 | 12/1979 | Green | 560/52 |
| 4,181,807 | 1/1980 | Green | 560/52 |
| 4,216,306 | 8/1980 | Boeckler | 528/115 |
| 4,220,513 | 9/1980 | Green et al. | 204/159.23 |
| 4,243,793 | 1/1981 | Williams | 528/75 |
| 4,308,367 | 12/1981 | Green et al. | 525/529 |

FOREIGN PATENT DOCUMENTS

| | | |
|---|---|---|
| 890 | 3/1979 | European Pat. Off. . |
| 33896 | 8/1981 | European Pat. Off. . |
| 1215591 | 12/1970 | United Kingdom . |
| 1293722 | 10/1972 | United Kingdom . |
| 1390711 | 4/1975 | United Kingdom . |
| 1445814 | 8/1976 | United Kingdom . |
| 1474715 | 5/1977 | United Kingdom . |
| 1560822 | 2/1980 | United Kingdom . |

OTHER PUBLICATIONS

Derwent CPI Abstract No. 52728B/29 (of West German Offen. 2,800,356) 7/1979.

*Primary Examiner*—Richard L. Schilling
*Attorney, Agent, or Firm*—Luther A. R. Hall

[57] ABSTRACT

Polymerizable compositions comprise
(a) a compound containing
  (i) at least one acryloyloxy or methacryloyloxy group,
  (ii) at least one allyl, methallyl, or 1-propenyl group attached, either directly or through an oxygen atom or an oxycarbonyl group, to a carbon atom which forms part of an aromatic or cycloaliphatic nucleus, and
  (iii) at least one carboxylic acid group,
(b) a compound containing at least two mercaptan groups directly attached to aliphatic carbon atoms, in a proportion as to supply at least 0.8 such —SH group per allyl, methallyl, and 1-propenyl group in (a) but less than 1.0 such —SH group in (a) per acryloyl, methacryloyl, allyl, methallyl, and 1-propenyl group.

Examples of (a) are 2,2-bis(3-allyl-4-(3-(methacryloyloxy)-2-(2-carboxyethylcarbonyloxy)propoxy)-phenyl)propane, 1-(allyloxycarbonyl)-2,4-bis(3-(methacryloyloxy)-2-(2-carboxyethylcarbonyloxy)propoxycarbonyl)benzene, and diallyl bis(3-(methacryloyloxy)-2-(2-carboxyethylcarbonyloxy)propyl) esters of benzophenone-3,4,3',4'-tetracarboxylic acid. Examples of (b) are pentaerythritol tetrathioglycollate, trimethylolpropane trithioglycollate, and 3,6-dioxa-1,8-dimercapto-octane.

The compositions may be polymerized by means of actinic irradiation in the presence of an added or "built-in" photosensitizer or by the action of a free-radical catalyst. They are especially useful in the production of printed circuits.

7 Claims, No Drawings

CARBOXYL-CONTAINING COMPOSITIONS AND THEIR POLYMERIZATION

BACKGROUND OF THE INVENTION

This invention relates to compositions comprising a polymercaptan which has at least two mercaptan (—SH) groups and a compound which has both at least two, preferably at least three, ethylenically-unsaturated double bonds and at least one free carboxyl group. It also relates to the polymerisation of such compositions by means of actinic radiation and/or heat-activated free-radical catalysts, and to the use of the polymerised products as surface coatings, as adhesives, and in reinforced composites, but particularly in printed circuits.

In U.S. Pat. No. 4,220,513 there are described compositions comprising (1) a compound containing in the same molecule both at least one 1,2-epoxide group and at least two groups chosen from allyl, methallyl, and 1-propenyl groups, e.g., 2,2-bis(3-allyl-4-(glycidyloxy)phenyl)propane and bis(3-(1-propenyl)-4-glycidyloxy)phenyl)methane, and (2) a compound containing at least two mercaptan groups attached to aliphatic carbon atoms per molecule, e.g., pentaerythritol tetrathioglycollate.

The compositions are caused to polymerise by the reaction of mercaptan groups with the allyl, methallyl, or 1-propenyl groups under the influence of actinic irradiation or free-radical catalysts.

Such compositions which further contain (3) a heat-curing crosslinking agent for polyepoxides are also described; the polymerised products, containing more than one epoxide group per average molecule, could thus be subsequently crosslinked in situ.

Published British Patent Application No. 2,012,781 A discloses similar compositions, in which component (1) contains at least one phenolic hydroxyl group instead of at least one epoxide group, e.g., 2,2-bis(3-allyl-4-hydroxyphenyl)propane and bis(3-(1-propenyl)-4-hydroxyphenyl)methane, component (3) being correspondingly a heat-activated crosslinking agent for phenolaldehyde novolac resins. The polymerised products, containing more than one phenolic hydroxyl group per average molecule, could likewise be subsequently crosslinked in situ by heating.

We have now found that certain compounds containing acrylate or methacrylate ester groups can be caused to polymerise very rapidly by exposure to actinic radiation or to the action of free-radical catalysts in the presence of certain mercaptans to form products having valuable properties. The acrylate or methacrylate esters employed also contain allyl, methallyl, and/or 1-propenyl groups. It is believed, although the usefulness of this invention does not depend on the truth of this belief, that the allylic type double bonds react preferentially with the mercaptan groups, thus facilitating the polymer-forming processes taking place by means of the double bonds in the acrylic or methacrylic groups. Whatever the mechanisms of the reactions may be, it has been found that the compositions polymerise very rapidly to form surface coatings and adhesive bonds.

In the so-called negative resist method for producing printed circuits, a substrate is coated with a photopolymerisable composition and the coating is exposed to actinic radiation through an image-bearing transparency with substantially transparent and substantially opaque areas so that polymerisation takes place in the areas of the coating which have been struck by radiation. Alternatively, such exposure can be carried out using computer-controlled scanning laser beams instead of such a transparency. Then the image is "developed" by dissolving away with a suitable solvent the areas where polymerisation had not occurred, i.e., those areas which had not been struck by actinic radiation. Subsequently, the substrate, usually of copper, may be exposed to etching liquids so that the areas not protected by the remaining portions of the composition are etched. In further processing, such as in the manufacture of multilayer boards, the layer of composition remaining may have to be removed by mechanical means.

Disadvantages of process presently employed are that organic solvents are often used for development, with associated risks due to toxicity and flammability, and that mechanical processes for removing the photopolymerised composition may cause damage to the printed circuit.

As already indicated, the esters also contain carboxylic acid groups; if exposure to actinic radiation is effected as through a negative with substantially opaque areas, it is possible to remove the composition from unexposed areas by treatment with an aqueous alkaline solution, due to salt formation on the carboxylic acid groups. The use of an organic solvent for this purpose, with its attendant disadvantages of toxicity and/or flammability, is therefore avoided. A further advantage is that the polymerised composition can be subsequently removed if desired by use of more strongly basic aqueous solutions.

U.S. Pat. No. 4,120,721 describes radiation-curable compositions for use in coating and image-forming processes. The compositions comprise a polyunsaturated acrylic or methacrylic-terminated urethane, a vinyl monomer which is preferably an ester of acrylic or methacrylic acid, a polymercaptan containing at least two —SH groups per molecule, and a photoinitiator. To obtain the acrylic or methacrylic-terminated polyurethane, a di-isocyanate is caused to react with an hydroxy-substituted acrylate or methacrylate in an amount such that one stoichiometric equivalent of free isocyanate groups remains in the reaction product, then these isocyanate groups are caused to react with the stoichiometric equivalent of hydroxyl groups in a polyhydric alcohol, preferably a polyethylene glycol or a polypropylene glycol. In addition to approximately fifty hydroxyalkyl acrylates and methacrylates listed as suitable are 2-hydroxy-3-(allyloxy)-propyl acrylate, 2-hydroxy-3-cinnamylpropyl acrylate, 2-hydroxy-3-(crotonyloxy)propyl acrylate, and the corresponding methacrylates. The polymers specifically described were made from a hydroxyalkyl acrylate or hydroxyalkyl methacrylate and lacked allylic-type double bonds. There is no suggestion that the use of acrylic or methacrylic-terminated urethanes derived from hydroxyalkyl acrylates which contain additional ethylenic unsaturation confers any advantage.

In British Pat. No. 1,474,715 there are described photopolymerisable acrylic esters containing free carboxylic acid groups which are prepared by the reaction of an at least dianhydride of a polycarboxylic acid with an alcohol containing at least two acrylic ester groups. In U.S. Pat. Nos. 4,079,183, 4,181,807, and 4,179,577 there are described photopolymerisable compounds containing free carboxylic acid groups and some specific unsaturated groups linking two aromatic rings, obtained by reaction of an at least dianhydride of a polycarboxylic acid with alcoholic hydroxyl groups of an alcohol containing at least one of the specified unsaturated groups. In all of these publications removal of the unphotopolymerised material by contact with an aqueous alkaline solution is described, but the photopolymerisation of such materials in the presence of a polymercaptan is not mentioned.

SUMMARY OF THE INVENTION

One aspect of this invention accordingly provides polymerisable compositions comprising
(a) a compound containing in the molecule
 (i) at least one group selected from acryloyloxy and methacryloyloxy groups,
 (ii) at least one group selected from allyl, methallyl, and 1-propenyl groups each of which is attached, either directly or through an oxygen atom or an oxycarbonyl group (—OCO—), to a carbon atom which forms part of an aromatic or cycloaliphatic nucleus, and
 (iii) at least one carboxylic acid —(COOH) group,
(b) a compound containing, per molecule, at least two mercaptan groups directly attached to an aliphatic carbon atom or atoms, in a proportion as to supply at least 0.8 such mercaptan group per group selected from allyl, methallyl and 1-propenyl groups in (a) but less than 1.0 such mercaptan group per group selected from acryloyl, methacryloyl, allyl, methallyl, and 1-propenyl groups in (a).

Other aspects of this invention include a process for the polymerisation of such compositions, comprising exposing them to actinic radiation or to the effect of a free-radical catalyst, and the polymerised products obtained by such a process.

DETAILED DISCLOSURE

In the compositions of this invention component (a) preferably contains no ethylenic unsaturation other than in acryloyloxy, methacryloyloxy, allyl, methallyl, and 1-propenyl groups, and preferably the total of the groups (i) and (ii) per molecule is at least three. It preferably has a molecular weight of at most 5000. Preferably the, or each, acryloyloxy or methacryloyloxy group is attached to an aromatic, cycloaliphatic, or heterocyclic nucleus through a group of formula

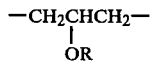        I where R denotes either a hydrogen atom or a monovalent acyl residue of an at least dicarboxylic acid (i.e., the residue after removal of the hydroxyl group forming part of a carboxylic acid group and linked to the indicated oxygen atom through the carbonyl group of the said carboxylic acid group).

The group of formula I is preferably attached either to a carbon atom of an aromatic nucleus through an oxygen atom or to a nitrogen atom forming part of a heterocyclic ring. R is further preferably of formula

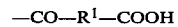        II where $R^1$ denotes an alkylene, arylene, or aralkylene group, any of which groups may be substituted by one or more allyl, methallyl, or 1-propenyl groups or by one or more carboxylic acid groups, the said alkylene group and the alkylene portion of the aralkylene group having from 2 to 10 carbon atoms, and the said arylene group and the arylene portion of the aralkylene group having from 6 to 10 carbon atoms.

Preferably component (a) contains at least two and at most six groups chosen from acryloyloxy and methacryloyloxy groups per molecule, at least two and at most fifteen groups chosen from allyl, methallyl, and 1-propenyl groups per molecule, and at least two and at most fifteen carboxylic acid groups per molecule.

Yet further preferred as component (a) are compounds in which the total number per molecule of groups chosen from acryloyloxy and methacryloyloxy groups is the same as the total number in that molecule of groups chosen from allyl, methallyl, and 1-propenyl groups, and also is the same as the total number of carboxylic acid groups in that molecule.

The or each aromatic nucleus in component (a) is preferably a benzene nucleus or a naphthalene nucleus.

Further preferred as component (a) are polyhydric phenols, at least two phenolic hydroxyl groups of which are esterified with acryloyl or methacryloyl groups through a carboxylic acid-containing group of formula I or II and at least two phenolic hydroxyl groups of which are directly etherified with groups chosen from allyl, methallyl, and 1-propenyl groups.

Particularly preferred as component (a) are polyhydric phenols, at least two phenolic hydroxyl groups of which are esterified with groups chosen from acryloyl and methacryloyl groups through a carboxyl-containing group of formula I or II, the polyhydric phenol being substituted directly on carbon atoms in the benzene or naphthalene nucleus or nuclei by at least two groups chosen from allyl, methallyl, and 1-propenyl groups, especially such compounds where these groups are ortho to the said acryloyl or methacryloyl groups.

Examples of compounds suitable as component (a) are those of the following formulae:

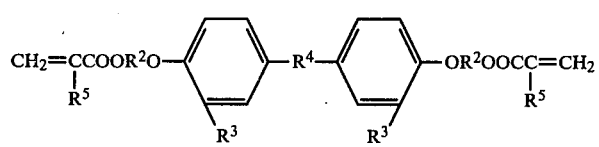  III

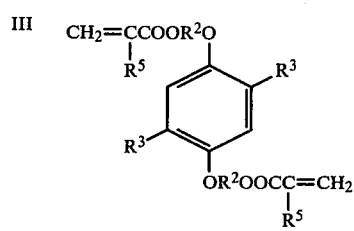  IV

-continued
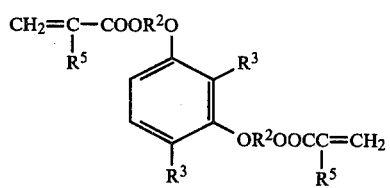 V
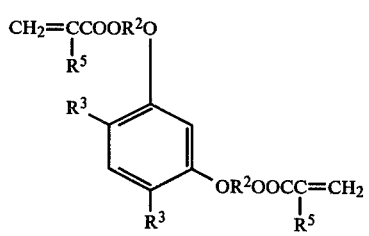 VI
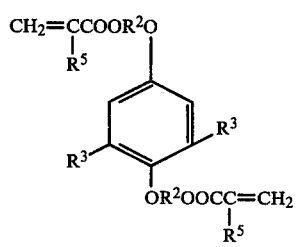 VII
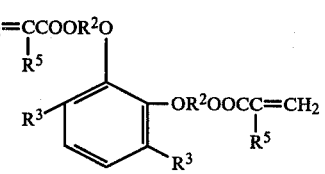 VIII
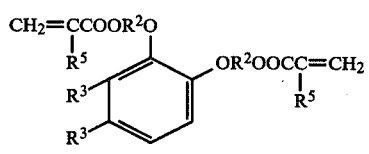 IX
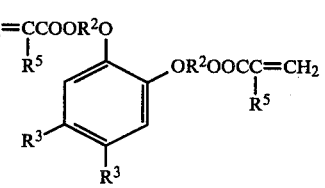 X
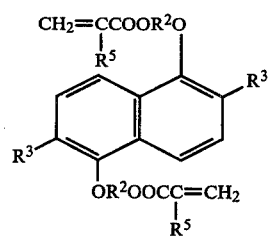 XI
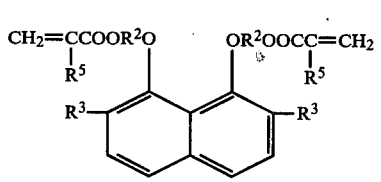 XII
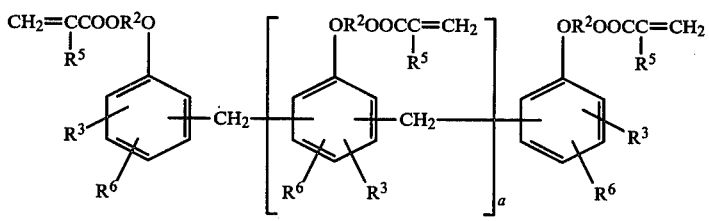 XIII
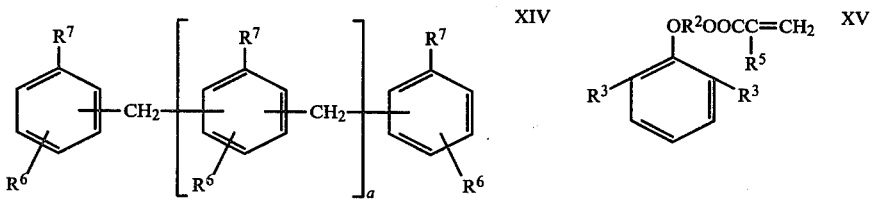 XIV
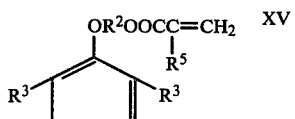 XV
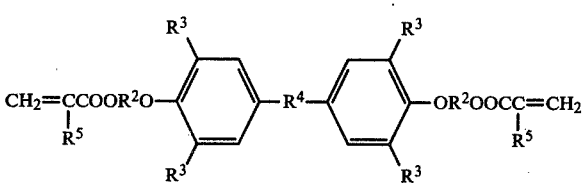 XVI

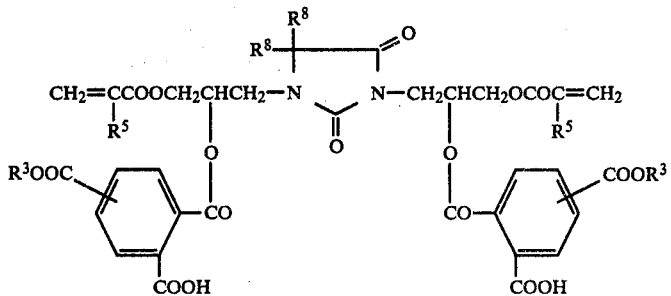

XVII and

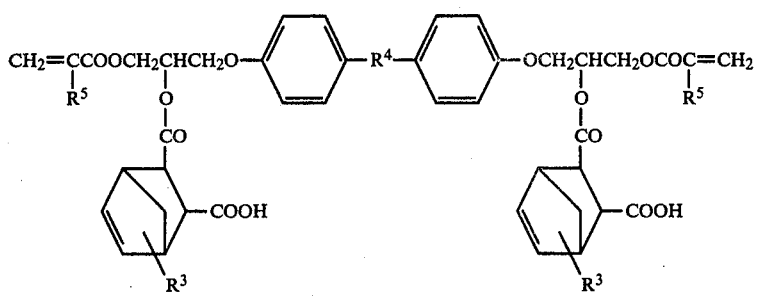

XVIII where a is an integer of from 1 to 6, each $R^2$ denotes a carboxylic acid-containing group of formula I, each $R^3$ denotes an allyl, methallyl, or 1-propenyl group, $R^4$ denotes a carbon-carbon bond, an alkylene or alkylidene group of up to 5 carbon atoms, an ether oxygen atom, a sulphur atom, or a group of formula —CO—, —SS—, —SO—, or —$SO_2$—, each $R^5$ denotes a hydrogen atom or a methyl group, each $R^6$ denotes a hydrogen, chlorine, or bromine atom or an alkyl group of 1 to 4 carbon atoms, and each $R^7$ denotes a group of formula $CH_2\!=\!C(R^5)COOR^2O$— or an allyloxy, methallyloxy, or 1-propenyloxy group such that at least one denotes a said group of formula $CH_2\!=\!C(R^5)COOR^2O$— and at least two each denote an allyloxy, methallyloxy, or 1-propenyloxy group, $R^8$ denotes an alkyl group of 1 to 10 carbon atoms, an aralkyl group of 7 to 16 carbon atoms, or an aryl group of 6 to 10 carbon atoms, with the proviso that, in formulae XIII and XIV, each —$CH_2$— and $R^3$— group shown is ortho or para to an indicated group $CH_2\!=\!C(R^5)COOR^2O$— and $R^7$—.

Specific examples of compounds suitable as component (a) are the partial esters with succinic, maleic, glutaric, adipic, phthalic, tetrahydrophthalic, hexahydrophthalic, endomethylenetetrahydrophthalic, pyromellitic, or trimellitic acids of the following alcohols:

2,2-bis(3-allyl-4-(3-(methacryloyloxy)-2-hydroxypropoxy)phenyl)propane, bis(3-allyl-4-(3-(methacryloyloxy)-2-hydroxypropoxy)phenyl)methane, 2,2-bis(3-methallyl-4-(3-(methacryloyloxy)-2-hydroxypropoxy)phenyl)propane, bis(3-methallyl-4-(3-(methacryloyloxy)-2-hydroxypropoxy)phenyl)methane, 2,2-bis(3-(1-propenyl)-4-(3-(methacryloyloxy)-2-hydroxypropoxy)phenyl)propane, bis(3-(1-propenyl)-4-(3-(methacryloyloxy)-2-hydroxypropoxy)phenyl)methane, and their acryloyl analogues:

1,3-diallyl-2-(2-hydroxy-3-(methacryloyloxy)propoxy)benzene, 1,3-dimethallyl-2-(2-hydroxy-3-(methacryloyloxy)propoxy)benzene, 1,3-di(1-propenyl)-2-(2-hydroxy-3-(methacryloyloxy)propoxy)benzene, and their acryloyl analogues;

2,2-bis(3,5-diallyl-4-(3-(methacryloyloxy)-2-hydroxypropoxy)phenyl)propane, bis(3,5-diallyl-4-(3-(methacryloyloxy)-2-hydroxypropoxy)phenyl)methane, 2,2-bis(3,5-dimethallyl-4-(3-(methacryloyloxy)-2-hydroxypropoxy)phenyl)propane, bis(3,5-dimethallyl-4-(3-(methacryloyloxy)-2-hydroxypropoxy)phenyl)methane, 2,2-bis(3,5-di(1-propenyl)-4-(3-(methacryloyloxy)-2-hydroxypropoxy)phenyl)propane, and bis(3,5-di(1-propenyl)-4-(3-(methacryloyloxy)-2-hydroxypropoxy)phenyl)methane, and their acryloyl analogues.

Other compounds which may be used as component (a) contain one to four carboxylic acid groups, two acryloyloxy or methacryloyloxy groups, and only one allyl, methallyl, or 1-propenyl group per molecule. The latter group may be attached to an oxycarbonyl group which is in turn directly attached to a carbon atom which forms part of an aromatic nucleus, as in those of formula

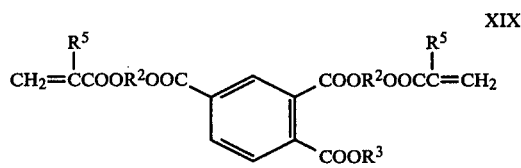

XIX or

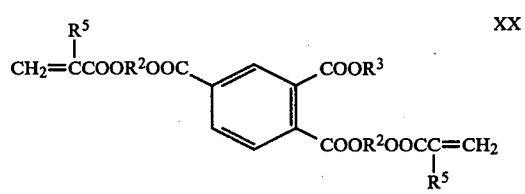

XX where each $R^2$, $R^3$, and $R^5$ have the meaning assigned in formula III.

Specific examples of compounds of formula XIX or XX are the partial esters with succinic, maleic, glutaric, adipic, phthalic, tetrahydrophthalic, hexahydrophthalic, endomethylenetetrahydrophthalic, or trimellitic acid with the following alcohols:

1-(allyloxycarbonyl)-2,4-bis(3-(methacryloyloxy)-2-hydroxypropoxycarbonyl)benzene, 1-(allyloxycarbonyl)-2,5-bis(3-(methacryloyloxy)-2-hydroxypropoxycarbonyl)benzene, 1-(methallyloxycarbonyl)-2,4-bis(3-(methacryloyloxy)-2-hydroxypropoxycarbonyl)benzene, 1-(methallyloxycarbonyl)-2,5-bis(3-(methacryloyloxy)-2-hydroxypropoxycarbonyl)benzene, 1-(1-propenyloxycarbonyl)-2,4-bis(3-(methacryloyloxy)-2-hydroxypropoxycarbonyl)benzene, 1-(1-propenyloxycarbonyl)-2,5-bis(3-(methacryloyloxy)-2-hydroxypropoxycarbonyl)benzene, and the corresponding acryloyloxy compounds.

There may also be used as component (a) products which contain six or more (e.g., twelve) allyl, methallyl, or 1-propenyl groups per molecule and which may be obtained by processes involving advancement. For example, a diglycidyl ether of a dihydric phenol which is substituted in the aromatic nucleus or nuclei by one or more allyl, methallyl, or 1-propenyl groups may be advanced with a dihydric phenol, a dihydric alcohol, a dicarboxylic acid, or a hydantoin having two free —NH— groups in the hydantoin ring or rings. The advanced product is then caused to react, at the phenolic or newly-formed secondary hydroxyl groups, with glycidyl acrylate or glycidyl methacrylate, or with acryloyl chloride or methacryloyl chloride, or at terminal epoxide groups with acrylic acid or methacrylic acid, and the product caused to react with the anhydride of a di- or poly-carboxylic acid.

Other advanced products containing six or more allyl, methallyl, or 1-propenyl groups may be obtained by advancement of diglycidyl ethers of dihydric phenols, diglycidyl ethers of dihydric alcohols, or di(N-glycidyl)hydantoins such as 1,3-diglycidylhydantoin and 3,3'-diglycidyl-1,1'-methylenebis(hydantoin) with a dihydric phenol substituted in the aromatic nucleus or nuclei by one or more allyl, methallyl, or 1-propenyl groups, followed by reaction at the phenolic or newly-formed secondary hydroxyl groups with glycidyl acrylate, glycidyl methacrylate, acryloyl chloride or methacryloyl chloride, or at terminal epoxide groups with acrylic acid or methacrylic acid, and the product caused to react with the anhydride of a di- or poly-carboxylic acid.

There may also be used as component (a) benzophenone derivatives of the formula

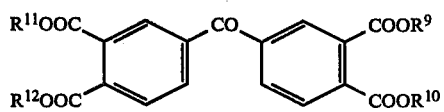

XXI where one of $R^9$ and $R^{10}$, and one of $R^{11}$ and $R^{12}$, have the same meaning and each denotes an allyl or methallyl group, and each of the remaining symbols of $R^9$ and $R^{10}$, and of $R^{11}$ and $R^{12}$, denote the residue of an alcohol, after removal of an alcoholic hydroxyl group, said residue containing both a carboxylic acid group and an acryloyloxy or methacryloyloxy group.

Preferably each of the remaining symbols of $R^9$ and $R^{10}$, and of $R^{11}$ and $R^{12}$, represent a group of formula

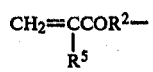

XXII where $R^2$ and $R^5$ have the meanings assigned in formula III.

Other compounds suitable for use as component (a) are of the formula

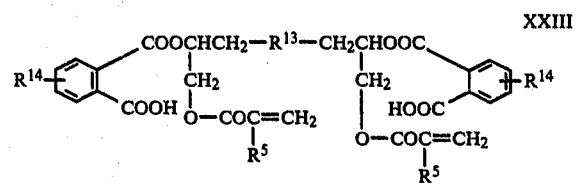

XXIII wherein
$R^5$ has the meaning assigned in formula III,
$R^{13}$ represents a group of formula

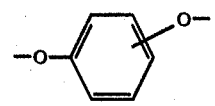

XXIV

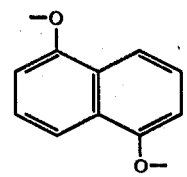

XXV

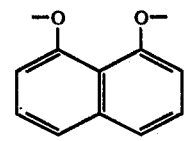

XXVI

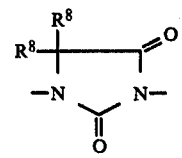

XXVII

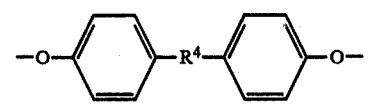

XXVIII (wherein $R^4$ and $R^8$ have the meanings assigned in formula III), and $R^{14}$ denotes an allyl, methallyl, 1-propenyl, allyloxycarbonyl, methallyloxycarbonyl, 1-propenyloxycarbonyl, diallylamino, dimethylallylamino, or di(1-propenyl)amino group.

Most previously known substances which polymerise on exposure to actinic radiation are used with a photoinitiator such as benzoin and its alkyl ethers to shorten the exposure time required for polymerisation. However, sometimes the use of an initiator is inconvenient. Thus, it may alter the electrical properties of the polymer. It may volatilise on being heated, so making it unsuitable for use in multilayer printed circuits; hence, in their preparation, the polymer is often removed after a metal etching process has taken place, which removal adds to the cost of the laminates and may cause damage to the surface of the metal.

It is well known to prepare photopolymerisable substances containing a residue of certain olefinically-unsaturated monocarboxylic acids, especially acryloyloxy, methacryloyloxy, sorboyloxy, cinnamoyloxy, or 3-(2-furyl)acryloyloxy groups, which are generally employed with a photoinitiator such as those aforesaid. In British Patent Specification No. 1,464,287 it is disclosed that addition of a photoinitiator can be avoided by incorporating chalcone or chalcone-like groups into a molecule of a compound having such a residue of an olefinically-unsaturated monocarboxylic acid.

Recently, photopolymerisable photosensitising compounds have been described U.S. Pat. No. 4,177,122) which are prepared by addition of an alkylene oxide to the phenolic hydroxyl group or groups of a hydroxyl-substituted benzophenone, followed by esterification with an unsaturated carboxylic acid such as acrylic acid or reaction with glycidyl acrylate. Others have been prepared (see West German Offenlegungsschrift No. 2 800 356) by reaction of a compound containing more than one 1,2-epoxide group with a stoichiometric deficit of ammonia and/or an aliphatic or cycloaliphatic primary and/or secondary amine, then with a carboxyl-substituted benzophenone, and lastly with acrylic acid or methacrylic acid.

It is also known that olefinically-unsaturated compounds, for example, those containing allyl groups, undergo an addition reaction at the ethylenic double bonds with polymercaptans, which reaction may be initiated by actinic radiation (see, e.g., British Patent Specification Nos. 1,215,591 and 1,445,814, the already mentioned published British Patent Application No. 2,012,781A, and also U.S. Pat. Nos. 3,615,450 and 4,220,513). It is usually necessary to employ a photoinitiator with such mixtures of polymercaptans and olefinically-unsaturated compounds.

We have found that the use of an additional photoinitiator can be avoided by employment, as component (a), of compounds of formula XXI.

Specific examples of compounds of formula XXI are benzophenone-3,4,3',4'-tetracarboxylic acid X',X'-diallyl ester Y,Y'-bis(3-methacryloyloxy)-2-(2-carboxyethoxycarbonyloxy)propyl) esters. (The significance of the designations X,X',Y, and Y' is explained below.)

The compounds used as component (a) in the compositions of this invention are believed to be new.

Compounds of formulae III to XII where each $R^3$ denotes allyl or methallyl are obtainable by conversion of the corresponding diallylphenols or dimethallylphenols into their glycidyl ethers and opening of the epoxide groups through reaction of these with acrylic or methacrylic acid and esterification of the resulting secondary alcoholic hydroxyl groups with an anhydride of a di- or poly-carboxylic acid. Alternatively, they may be obtained by the corresponding reaction of the aforesaid diallylphenols or dimethallylphenols with glycidyl acrylate or glycidyl methacrylate, followed by esterification with an anhydride as described above.

Compounds of formula XIII where each $R^3$ denotes allyl or methallyl are obtainable by conversion of a corresponding phenol-formaldehyde novolac into its tri- or higher allyl or methallyl ether, conversion of these allyl or methallyl-substituted novolacs into their glycidyl ethers, opening of the epoxide groups through reaction of these with acrylic or methacrylic acid, and esterification with an anhydride as described above. Alternatively, they may be obtained by the reaction of the aforesaid allyl or methallyl-substituted novolacs with glycidyl acrylate or glycidyl methacrylate, followed by esterification with an anhydride as described above.

Compounds of formula XIV where at least two groups $R^7$ each denote allyloxy or methallyloxy are obtainable by etherification of at least two phenolic hydroxyl groups in a phenol-formaldehyde novolac by reaction with allyl chloride or methallyl chloride, conversion of the remaining phenolic hydroxyl group or groups into glycidyl groups, reaction of these glycidyl groups with acrylic or methacrylic acid, and finally esterification with an anhydride of a di- or poly-carboxylic acid. Alternatively, at least two phenolic hydroxyl groups may be etherified by means of allyl chloride or methallyl chloride, the remaining phenolic hydroxyl group or groups caused to react with glycidyl acrylate or methacrylate, and the secondary hydroxyl groups thus formed are esterified with an anhydride of a di- or poly-carboxylic acid.

Compounds of formula XV and XVI, where the or each $R^2$ denotes a group of formula I and each $R^3$ denotes allyl or methallyl are obtainable by conversion of the phenolic hydroxyl group in the diallyl or dimethallylphenol, or both phenolic hydroxyl groups in the tetra-allyl or tetramethallylbisphenol, into a glycidyl ether group or groups followed by reaction with acrylic or methacrylic acid and then with an anhydride as before. Alternatively, the diallyl or dimethallylphenol or the tetraallyl or tetramethallylbisphenol may be caused to react with, correspondingly, one or two mols. of glycidyl acrylate or glycidyl methacrylate, followed by esterification with an anhydride as previously described.

Compounds of formulae III or XVI where each $R^3$ denotes a 1-propenyl group may be prepared in a manner that is the same as that of their allyl analogues but including the stage of isomerising the allyl groups through heating with an alkali prior to the final esterification with an anhydride of a di- or polycarboxylic acid.

The formation of allyl and methallyl ethers of monohydric and polyhydric phenols and their Claisen rearrangement is described in the already cited published British Patent Application No. 2,012,781 A and in U.S. Pat. No. 4,220,513, including the preparation of 2,6-diallylphenols, 2,6-dimethallylphenols, 2,2',6,6'-tetra-allylbisphenols and 2,2',6,6'-tetramethallylbisphenols, and also the conversion of allylphenols into their glycidyl ethers. The isomerisation of aryl allyl ethers into aryl 1-propenyl ethers is also described in these publications.

Compounds of formula XVIII may be prepared by esterification of a diglycidyl compound of the formula

XXIX

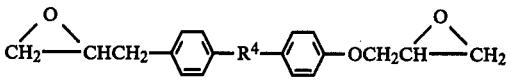

with acrylic or methacrylic acid, and further esterification on the newly formed secondary hydroxyl groups with an endomethylenetetrahydrophthalic anhydride of formula

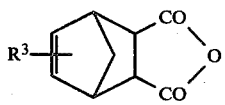 XXX wherein R³ and R⁴ have the meanings assigned in formula III.

Compounds of formula XIX and XX may be made by reaction of trimellitic anhydride with allyl or methallyl alcohol, and isomerising the allyl group if required, to give the mixed isomers of formula

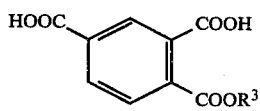 XXXI and

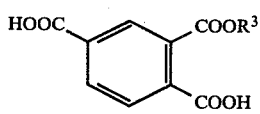 XXXII

The compounds of formula XXXI and XXXII may then be caused to react with glycidyl acrylate or glycidyl methacrylate in a manner known per se and esterified with a di- or polycarboxylic acid anhydride to afford the products of formula XIX or XX where $R^9$ denotes a group of formula I. The same products may alternatively be obtained by converting the dicarboxylic acids of formula XXXI or XXXII into their diglycidyl esters, opening the epoxide groups in a manner known per se with acrylic acid or methacrylic acid, and esterifying as before.

Compounds of formula XXI may be readily prepared from benzophenone-3,4,3',4'-tetracarboxylic acid dianhydride, which is commercially available. Thus, on heating this dianhydride with allyl alcohol or methallyl alcohol there are afforded benzophenone-3,4,3',4'-tetracarboxylic acid X,X'-diallyl esters and the corresponding X,X'-dimethallyl esters. It is considered that the products comprise the three possible isomers, viz., respectively, the 3,3'-dicarboxy-4,4'-bis(allyloxycarbonyl), the 4,4'-dicarboxy-3,3'-bis(allyloxycarbonyl), and the 3,4'-dicarboxy-3',4-bis(allyloxycarbonyl) derivatives of benzophenone, and, where methallyl alcohol is employed, their methallyl homologues. However, the utility of this invention does not depend on the truth of this belief.

Reaction of these diester-dicarboxylic acids with epichlorohydrin followed by dehydrochlorination, in a known manner for the production of glycidyl esters from carboxylic acids, yields benzophenone-3,4,3',4'-tetracarboxylic acid X,X'-diallyl esters Y,Y'-diglycidyl esters and the corresponding methallyl compounds. Reaction of these diallyl and diglycidyl esters with acrylic acid or with methacrylic acid gives the X,X'-diallyl Y,Y'-bis(3-(acryloyloxy)-2-hydroxypropyl) tetra-esters or the corresponding methacryloyl homologues, i.e., the compounds of formula XXI where one of $R^9$ and $R^{10}$ and one of $R^{11}$ and $R^{12}$ each denotes an allyl group and the remaining symbols of $R^9$ and $R^{10}$, and $R^{11}$ and $R^{12}$, each denote a group of formula XXII. These tetra-esters may also be obtained by reaction of 3,4,3',4'-tetracarboxylic acid X,X'-diallyl esters with 2 molar proportions of glycidyl acrylate or glycidyl methacrylate. The methallyl homologues may be prepared in a similar manner. Esterification using an anhydride of a di- or poly-carboxylic acid gives the desired products.

Compounds of formula XVII may be prepared by reaction of a 1,3-diglycidylhydantoin, substituted by $R^8$ in the 5 positions, with acrylic or methacrylic acid and esterification of the resultant secondary hydroxyl groups with an anhydride of the formula

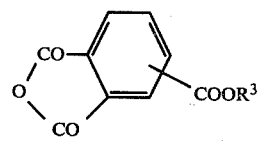 XXXIII where $R^3$ has the meaning assigned in formula III, or by reaction of a so substituted hydantoin with glycidyl acrylate or glycidyl methacrylate and esterification with an anhydride of formula XXXIII.

The anhydrides of formula XXXIII are themselves prepared by reaction of trimellitic anhydride with thionyl chloride to form the acid chloride-anhydride, and reaction of this with an alcohol R³OH.

Compounds of formula XXIII may be prepared by esterification of a diglycidyl compound of formula

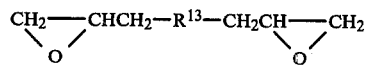 XXXIV with acrylic or methacrylic acid and further esterification of the resulting secondary hydroxyl groups with an anhydride of formula

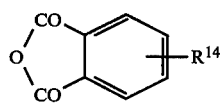 XXXV where $R^{13}$ and $R^{14}$ have the meanings assigned in formula XXIII, or by reaction of the phenol or hydantoin H—$R^{13}$—H with glycidyl acrylate or glycidyl methacrylate and esterification with an anhydride of formula XXXV.

A wide range of polymercaptans is suitable for use as component (b) in the compositions of this invention. Preferably the mercaptans are free from any allyl, methallyl, 1-propenyl, acryloyl or methacryloyl group, and preferably they have a molecular weight of not more than 3,000. The polymercaptans employed usually contain not more than six mercaptan groups per molecule directly attached to aliphatic carbon atoms. Preferably, however, they contain more than two such mercaptan groups.

One class comprises esters of monomercaptanalkylenecarboxylic acids with polyhydric alcohols or of aliphatic monomercaptanmonohydric alcohols with polycarboxylic acids.

Further preferred such esters are of the formula

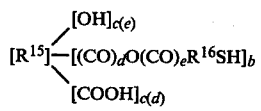 XXXVI where $R^{15}$ represents an aliphatic or araliphatic hydrocarbon radical of from 2 to 60 carbon atoms, which may be interrupted in the chain by not more than one ether oxygen atom, $R^{16}$ represents an aliphatic hydrocarbon radical, which may be interrupted in the chain by not more than one carbonyloxy group, and is preferably of from 1 to 4 carbon atoms, b is an integer of from 2 to 6, preferably 3 to 6, c is zero or a positive integer of at most 3, such that (b+c) is at most 6 (terms such as c(d) being construed algebraically), and d and e each represent zero or 1, but are not the same.

Yet further preferred esters are polymercaptans of formula XXXVI which are also of the formula $$R^{17}(OCOR^{18}SH)_b \qquad \text{XXXVII}$$

where b has the meaning assigned in formula XXXVI, $R^{17}$ is an aliphatic hydrocarbon radical of from 2 to 10 carbon atoms, and $R^{18}$ denotes —(CH$_2$)—, —(CH$_2$)$_2$—, or —CH(CH$_3$)—.

A second class comprises mercaptan-containing esters, including esters of monomercaptandicarboxylic acids, of formula $$R^{21}\text{\textemdash}[(O)_d\text{\textemdash}CO(O)_e\text{\textemdash}R^{19}(O)_e\text{\textemdash}CO(O)_d\text{\textemdash}R^{20}SH]_f \qquad \text{XXXVIII}$$

where d and e have the meanings assigned in formula XXXVI, f is an integer of from 1 to 6, preferably from 2 to 6, $R^{19}$ represents a divalent organic radical, linked through a carbon atom or carbon atoms thereof to the indicated —O— or —CO— units, $R^{20}$ represents a divalent organic radical, linked through a carbon atom or carbon atoms thereof to the indicated —SH group and —O— or —CO— unit, and $R^{21}$ represents an organic radical, which must contain at least one aliphatic —SH group when f is 1 and preferably contains at least one such group when f is 2, linked through a carbon atom or carbon atoms thereof to the indicated adjacent —O— or —CO— unit or units.

When d is zero, $R^{19}$ preferably denotes a saturated aliphatic unbranched hydrocarbon chain of 2 to 20 carbon atoms, which may be substituted by one or more methyl groups and by one or more mercaptan groups and which may be interrupted by one or more ether oxygen atoms and by one or more carbonyloxy groups. When d is 1, $R^{19}$ preferably denotes (i) a saturated aliphatic hydrocarbon group of 2 to 10 carbon atoms, which may bear a mercaptan group, (ii) a cycloaliphatic-aliphatic hydrocarbon group of 5 to 34 carbon atoms, which may contain one or more ethylenically-unsaturated double bonds, or (iii) a mononuclear arylene hydrocarbon group of 6 to 12 carbon atoms.

$R^{20}$ preferably denotes, when d is zero, a saturated aliphatic hydrocarbon group of 1 to 3 carbon atoms, which may bear a carboxyl group, and, when d is 1, it preferably denotes a saturated aliphatic hydrocarbon group of 2 to 4 carbon atoms, which may be substituted by a hydroxyl group or by a chlorine atom.

$R^{21}$ preferably denotes (iv) an aliphatic or cycloaliphatic-aliphatic hydrocarbon group of 2 to 51 carbon atoms, which may bear at least one aliphatic mercaptan group, or (v) a mononuclear or dinuclear arylene hydrocarbon group of 6 to 15 carbon atoms, or (vi) a chain of 4 to 20 carbon atoms, interrupted by at least one ether oxygen atom and optionally substituted by at least one aliphatic mercaptan group, or (vii) a chain of 6 to 50 carbon atoms, interrupted by at least one carbonyloxy group, optionally interrupted by at least one ether oxygen atom, and optionally substituted by at least one aliphatic mercaptan group.

A third class comprises esters and ethers which are of the general formula

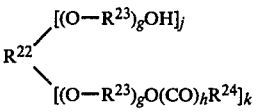

XXXIX where $R^{22}$ represents a radical of a polyhydric alcohol after removal of (j+k) alcoholic hydroxyl groups, especially an aliphatic hydrocarbon radical of from 2 to 10 carbon atoms, each $R^{23}$ denotes an alkylene group containing a chain of at least 2 and at most 6 carbon atoms between the indicated consecutive oxygen atoms, $R^{24}$ represents an aliphatic radical of 1 to 6 carbon atoms containing at least one mercaptan group, g is a positive integer, preferably such that the average molecular weight of the polymercaptan is not more than 2,000, h is zero or 1, j is zero or a positive integer such that (j+k) is at most 6, and k is an integer of from 2 to 6, preferably of from 3 to 6.

The groups $R^{23}$ in individual poly(oxyalkylene) chains may be the same or different and they may be substituted by, e.g., phenyl or chloromethyl groups. Preferably they are —C$_2$H$_4$— or —C$_3$H$_6$— groups.

Preferred amongst the compounds of formula XXXIX are the esters of formula

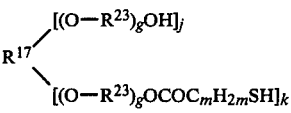

XL and ethers of formula

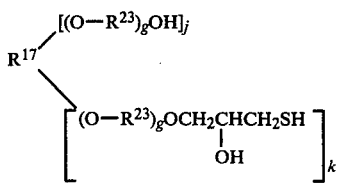

XLI where $R^{17}$ has the meaning assigned in formula XXXVII, $R^{23}$, g, j, and k have the meanings assigned in formula XXXIX, and m is 1 or 2.

A fourth class of polymercaptans suitable as component (b) comprises mercaptan-terminated sulphides of the general formula

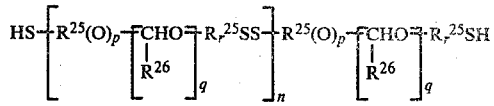

where each $R^{25}$ denotes an alkylene hydrocarbon group containing from 2 to 4 carbon atoms, $R^{26}$ denotes a hydrogen atom or a methyl or ethyl group, n is an integer which has an average value of at least 1, and is preferably such that the average molecular weight of the sulphide is at most 1000, and either p is zero, in which case q and r are each also zero, or p is 1, in which case q is zero or 1 and r is 1.

A fifth class of polymercaptans suitable as component (b) comprises mercaptan-terminated poly(butadienes) of the general formula

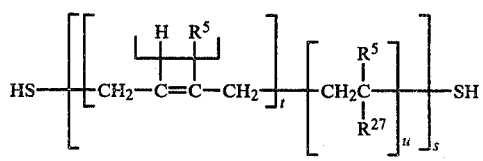

where each $R^5$ has the meaning assigned in formula III, $R^{27}$ represents —CN, —COOH, —CONH$_2$, —COOR$^{28}$, —C$_6$H$_5$, or —OCOR$^{28}$, where $R^{28}$ is an alkyl group of one to eight carbon atoms, t is an integer of at least one, u is zero or a positive integer, and s is an integer of more than one, preferably such that the average number molecular weight of the polymercaptan is not more than 1000.

A sixth class of polymercaptans for use as component (b) comprises the mercaptan-terminated oxyalkylene compounds of the general formula

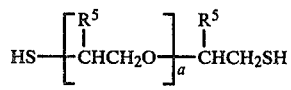

where each $R^5$ has the meaning assigned in formula III and a has the meaning assigned in formula XIII.

The substances of formulae XLII to XLIV, being dimercaptans, are not preferred.

A seventh class comprises poly(thioglycollates) and poly(mercaptopropionates) of tris(2-hydroxyethyl) isocyanurate, tris(2-hydroxypropyl) isocyanurate, N,N'-bis(2-hydroxyethyl)hydantoins and N,N'-bis(2-hydroxypropyl)hydantoins, i.e., the compounds of formula

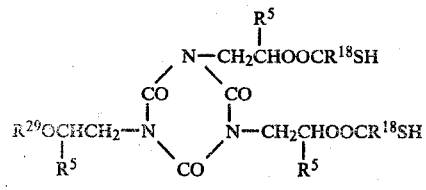

or

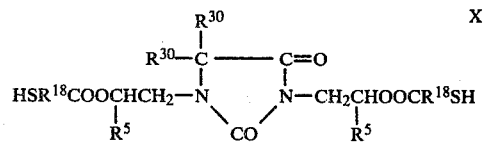

where each $R^5$ has the meaning assigned in formula III, each $R^{18}$ has the meaning assigned in formula XXXVII, $R^{29}$ denotes a group —OCR$^{18}$SH or a hydrogen atom, and each $R^{30}$ denotes an alkyl group of 1 to 8 carbon atoms, particularly a methyl or ethyl group, an aralkyl group of 7 to 9 carbon atoms, or an aryl group of 6 to 8 carbon atoms, or the two $R^{30}$ together with the attached carbon atom denote a cyclopentane or cyclohexane ring.

Specific examples of suitable polymercaptans are pentaerythritol tetrathioglycollate, dipentaerythritol hexakis(3-mercaptopropionate), trimethylolpropane trithioglycollate, and a tris(3-mercapto-2-hydroxypropyl ether) of a polyoxypropylene triol of average molecular weight 800.

In photopolymerising the compositions of this invention, actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of the photopolymerisable composition will depend upon a variety of factors which include, for example, the individual compounds used, the type of light source, and its distance from the irradiated composition. Suitable times may be readily determined by those familiar with photopolymerisation techniques.

For photopolymerisation, the compositions should (except those containing a compound of formula XXI) contain an added photoinitiator, i.e., a catalyst which, on irradiation, gives an excited state that leads to formation of free radicals which then initiate polymerisation of the composition. Examples of suitable photoinitiators are organic peroxides and hydroperoxides, α-halogen substituted acetophenones such as trichloromethyl 4'-tert.butylphenyl ketone, α-hydroxy-α-alkyl-substituted acetophenones such as 2-hydroxy-2-methyl-1-phenylpropan-1-one, benzoin and its alkyl ethers (e.g., the n-butyl ether), α-methylbenzoin, benzophenones such as benzophenone itself and 4,4′-bis(dimethylamino)benzophenone, O-alkoxycarbonyl derivatives of an oxime of benzil or of 1-phenylpropane-1,2-dione, such as benzil (O-ethoxycarbonyl)-α-monoxime and 1-phenylpropane-1,2-dione 2-(O-ethoxycarbonyl)oxime, benzil ketals, e.g., its dimethyl ketal, substituted thioxanthones, e.g., 2-chlorothioxanthone, anthraquinones, and photoredox systems comprising a mixture of a phenothiazine dye (e.g., methylene blue) or a quinoxaline (e.g., a metal salt of 2-(m- or p-methoxyphenyl)-quinoxaline-6′- or 7′-sulphonic acid) with an electron donor such as benzenesulphinic acid or other sulphinic acid or a salt thereof such as sodium salt, or an arsine, a phosphine, or thiourea.

Suitable photoinitiators are readily found by routine experimentation. Generally, 0.05 to 10%, and preferably 0.5 to 5%, by weight of the photoinitiator is incorporated, based on the combined weights of the components (a) and (b).

The term "free-radical catalyst" is used herein to refer to substances and does not include actinic radiation. Suitable free-radical catalysts for the polymerisation of the compositions of this invention are heat-activated, i.e., exert an appreciably rapid polymerising effect only at temperatures above normal ambient temperature, and include 2,2′-azobis(2-methylpropionitrile) and organic or inorganic peroxides, e.g., peracids and their salts and esters, such as peracetic acid, perbenzoic acid, perphthalic acid, di-isopropyl peroxydicarbonate, ammonium or an alkali metal perborate, ammonium or an alkali metal persulphate, acyl peroxides such as benzoyl peroxide, and also, e.g., cumyl peroxide, cumene hydroperoxide, hydrogen peroxide, cyclohexanone peroxide, and ethyl methyl ketone peroxide. A tertiary amine, e.g., dimethylaniline, or a cobalt siccative, e.g., cobalt naphthenate, may be used as an accelerator with the peroxides.

The amount of free-radical catalyst, together with any accelerator therefor, is usually from 0.05 to 5%, and preferably 0.1 to 1%, by weight, calculated on the total of the weights of the components (a) and (b). Standard methods of free radical catalyst-induced polymerisation can be employed.

The composition of this invention may, as already indicated, be used as surface coatings. They may be applied to a substrate such as steel, aluminium, copper, chromium, cadmium, zinc, tin, glass, ceramic, paper, or wood, preferably as a liquid, and photopolymerised, or induced to polymerise by means of the free-radical catalyst. By photopolymerising through actinic irradiation part of the coating, those sections which have not been exposed and are unpolymerised may be removed by washing with a dilute aqueous alkaline solution while leaving the photopolymerised portions in place.

Thus the compositions of this invention may be used in the production of printing plates and printed circuits. Methods of producing printing plates and printed circuits from photopolymerisable compositions are well known.

In the preparation of multilayer printed circuits a metallic substrate is coated with a photopolymerisable composition and then exposed to radiation through a negative. There may then follow a sequence of coating and an etching stage, in the course of which the polymerised coating must be removed. This is normally effected by physical means but it has now been found that, using a composition of this invention, the photopolymerised material can be completely removed without damage to the etched metal surface by treatment with an aqueous alkaline solution under conditions that are more vigorous than those used in the initial development. Such treatment exposes the metal underlying the photopolymerised layer without the need for any physical treatment.

Alkaline solutions used for the development of the image are preferably 0.5 to 5% aqueous sodium or potassium carbonate; those used to remove the photopolymerised resin are preferably 3 to 10% sodium or potassium hydroxide solutions, all these percentages being in parts by weight.

This invention accordingly provides articles bearing thereon a surface coating comprising a polymerised product produced by a process of this invention.

The compositions of this invention may also be used as adhesives, employing irradiation or a free radical catalyst to induce polymerisation of a layer of the composition sandwiched between surfaces, using the methods described in the already cited U.S. Pat. No. 4,220,513, the disclosures of which are incorporated herein by reference.

This invention accordingly provides articles having surfaces bonded together by means of a polymerised product made by a process of this invention.

The compositions are also useful in the production of fibre-reinforced composites, including sheet moulding compounds, and as dip-coating compositions, following the procedure described in U.S. Pat. No. 4,220,513 mentioned above.

We have further found that it is possible to cure the compositions of this invention in two stages: such a composition, containing a heat-activated free-radical catalyst and also a photoinitiator if necessary, may be partly polymerised by exposure to an amount of actinic radiation insufficient to cause complete polymerisation, and then it is heated so that the free-radical catalyst is activated and curing is completed.

Other aspects of this invention therefore comprise a composition containing a component (a) and a component (b) as aforesaid, a photoinitiator if necessary, and a heat-activated free-radical catalyst, and a process for curing such a composition comprising partially polymerising it by exposing it to actinic radiation and then heating it to activate the heat-activated free-radical catalyst.

Such compositions may be used to form film adhesives, composites, in dip-coating, and in making sheet moulding compositions as described in the cited U.S. Pat. No. 4,220,513.

Compositions of the invention may be marketed in two component packs, one containing component (a) and the other component (b). Otherwise, they may be stored until required as mixtures, protected from actinic radiation and sources of free radicals.

The following Examples illustrate the invention. Percentages are by weight.

2,2-Bis(3-allyl-4-(glycidyloxy)phenyl)propane, used as starting material, was prepared as follows:

2,2-Bis(3-allyl-4-hydroxyphenyl)propane was prepared as described in the above-mentioned U.S. Pat. No. 4,220,513. This product (308.0 g) was mixed with 2-methoxyethanol (10.0 g) and epichlorohydrin (740.0 g) and heated to 60° C. Sodium hydroxide flake (80.0 g) was added portionwise over 3 hours, and the mixture was stirred for a further ½ hour, also at 60° C.

The mixture was filtered, the residue being washed with toluene, and the filtrate was evaporated to remove the solvents and the excess of epichlorohydrin. The concentrated product was filtered once more to give 334 g of 2,2-bis(3-allyl-4-(glycidyloxy)phenyl)propane, having an epoxide content of 4.03 equiv./kg, and 4.5 allyl double bond equiv./kg.

EXAMPLE 1

2,2-Bis(3-allyl-4-glycidyloxy)phenyl)propane (100 g) and 2,6-di-tert.butyl-p-cresol (0.2 g) were mixed and heated to 100° C. To this mixture was added over 1 hour a mixture of methacrylic acid (40 g), a 5% solution of chromium octanoate in light petroleum (0.1 g), and 2,6-di-tert.butyl-p-cresol (0.4 g).

This mixture was heated at 100° C. for 6 hours and then treated with a mixture of methacrylic acid (4.76 g) and 2,6-di-tert.butyl-p-cresol (0.09 g), this mixture being added dropwise over 15 minutes. Heating at 100° C. was continued for a further 4 hours, when a sample was removed and tested for epoxide content, which was found to be zero.

Succinic anhydride (39.5 g) was added over 1 hour. The mixture was stirred at 100° C. for a further 3¼ hours, then cooled, to give 185 g of a product, containing a major proportion of 2,2-bis(3-allyl-4-(3-(methacryloyloxy)-2-(2-carboxyethylcarbonyloxy)propoxy)-phenyl)propane, as a viscous, dark yellow liquid.

Pentaerythritol tetrathioglycollate (50 g; i.e., 1 mercaptan group equiv. per allyl group equiv.) was added and the mixture was stirred until homogeneous to give Mixture A.

Benzil dimethyl ketal (0.15 g) was added to Mixture A (5 g) and the composition was applied as a coating to a copper-clad laminate, leaving a tacky film about 20 μm thick. This film was irradiated for 15 minutes through a negative supported 1 mm above the film using a 500 w medium pressure mercury arc lamp at a distance of 22 cm. After irradiation the image was developed by immersion of the laminate in 1% aqueous sodium carbonate solution at room temperature. The unexposed areas were washed away, leaving a good relief image on the copper. The uncoated copper areas could then be etched, using an aqueous solution of ferric chloride (41% FeCl$_3$) at 35° C., leaving the coated areas intact. The coating on these areas could be removed by treatment with 5% sodium hydroxide solution at room temperature.

EXAMPLE 2

A copper clad laminate was coated with Mixture A and benzil dimethyl ketal as described in Example 1 and then passed through a 'Mini-arc' apparatus supplied by Primarc Ltd. (Stoke Row, near Henley-on-Thames, Oxfordshire, England). This apparatus contains two medium pressure mercury arc lamps, rated at 80 w per cm, and was operated at a belt speed of 50 m per minute. This treatment made the coating tack-free but left it still photopolymerisable.

A negative was placed in contact with the coating and it was irradiated for 15 minutes as described in Example 1. Development in 2% aqueous sodium hydroxide solution produced a clear relief image on the laminate, which could then be etched as described in Example 1.

EXAMPLE 3

Mixture A (10 g), mixed with glycidyl methacrylate (1 g) and benzil dimethyl ketal (0.3 g), was applied as a coating 10 μm thick to tinplate. Exposure for 5 seconds to the irradiation from an 80 w per cm mercury arc lamp at a distance of 8 cm produced a coating that withstood over 20 rubs with a cotton wool swab soaked in acetone.

EXAMPLE 4

A mixture of trimellitic anhydride (57.6 g, recrystallised from acetic anhydride) and allyl alcohol (175 g) was heated under reflux for 4½ hours, then the excess of allyl alcohol was distilled off under reduced pressure to leave 74.5 g of the monoallyl esters of benzene-1,2,4-tricarboxylic acid as a white solid.

The mixture of allyl 2,4-dicarboxybenzoate and allyl 2,5-dicarboxybenzoate so obtained (50 g) was heated with 57 g of glycidyl methacrylate (2 mol. equiv.) in the presence of 0.17 g of trimethylammonium chloride and 0.2 g of 2,6-di-tert.butyl-p-cresol for 12 hours at 60° C. to afford a mixture of 1-(allyloxycarbonyl)-2,4- and -2,5-bis(3-(methacryloyloxy)-2-hydroxypropoxycarbonyl)benzene, i.e., the compounds of formulae

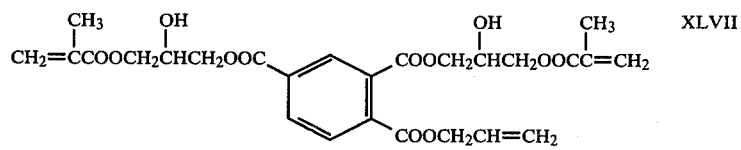

and

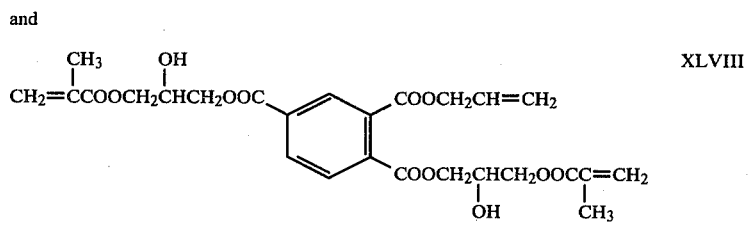

This product (50 g) was esterified with succinic anhydride (15 g) as described in Example 1. The resultant mixture, consisting predominantly of 1-(allyloxycarbonyl)-2,4-bis(3-(methacryloyloxy)-2-(2-carboxyethoxycarbonyl)propoxycarbonyl)benzene and 1-(allyloxycarbonyl)-2,5-bis(3-(methacryloyloxy)-2-(2-carboxyethoxycarbonyl)propoxycarbonyl)benzene, could then be blended with pentaerythritol tetrathioglycollate at the level of 1 mercaptan group equiv. per allyl group equiv. and photopolymerised as described in Example 1.

EXAMPLE 5

A mixture of the monoallyl esters of benzene-1,2,4-tricarboxylic acid was prepared as before from 64 g of trimellitic anhydride. This mixture was heated to 80° C. in the presence of a 5% solution of chromium octanoate in light petroleum (0.13 g) and 2,6-di-tert.butyl-p-cresol (0.26 g), and then 47.4 g of glycidyl methacrylate (i.e., 1 mol. equiv.) was added dropwise over 45 minutes. The mixture was stirred for a further 6 hours at 80° C., at which time the epoxide content was negligible.

The product consists of allyl-(2-(3-(methacryloyloxy)-2-hydroxypropoxycarbonyl)-4-carboxybenzoate and allyl 2-carboxy-4-(3-(methacryloyloxy)-2-hydroxypropoxycarbonyl)benzoate, together with allyl 2,4-dicarboxybenzoate and allyl 2,4-bis(3-(methacryloyloxy)-2-hydroxypropoxycarbonyl)benzoate, as well as the corresponding isomers derived from allyl 2,5-dicarboxybenzoate.

The product, which contains an average 1 carboxyl group, 1 allyl group attached through an oxycarbonyl group to an aromatic carbon atom, and 1 methacryloyloxy group per molecule (3.91 g) was mixed with 1.11 g of ethylene glycol dithioglycollate (i.e., 1 mercaptan group equiv. per allyl group equiv.) and 0.15 g of benzil dimethyl ketal and applied as a coating 10 μm thick onto a copper-clad laminate and irradiated for 1-2 seconds at 22 cm. with a lamp rated at 80 w per cm, becoming tack-free. Irradiation through a negative with a lamp rated at 30 w per cm for 20 minutes at 20 cm followed by development by 1% aqueous sodium carbonate solution with brushing gave a negative image.

EXAMPLE 6

The procedure of Example 5 was repeated, using, however, 1.14 g of pentaerythritol tetrathioglycollate (i.e., 1 mercaptan group equiv. per allyl group equiv.). On development a good negative image was obtained.

EXAMPLE 7

A mixture of 2,2-bis(3-(1-propenyl)-4-(glycidyloxy)phenyl)propane (49.2 g), tetramethylammonium chloride (0.1 g), and hydroquinone (0.15 g) was heated to 80° C., then methacrylic acid (20.4 g) was added dropwise over 1.5 hours. The mixture was stirred for a further 8 hours at 80° C. to afford 2,2-bis(3-(1-propenyl)-4-(3-(methacryloyloxy)-2-hydroxypropoxy)phenyl)propane, i.e., the compound of formula This compound (50 g) was esterified with succinic anhydride (13.5 g) as described in Example 1. A mixture of the resultant ester, i.e., 2,3-bis(3-(1-propenyl)-4-(3-(methacryloyloxy)-2-(2-carboxyethylcarbonyloxy)propoxy)phenyl)propane, with pentaerythritol tetrathioglycollate (1 mercaptan group equiv. per allyl group equiv.) could be photopolymerised as described in Example 1.

EXAMPLE 8

A mixture of 2,2-bis(3,5-diallyl-4-hydroxyphenyl)propane (194 g), glycidyl methacrylate (154 g), tetramethylammonium chloride (0.7 g), and 2,6-di-tert.butyl-p-cresol (2.8 g) was heated to 95° C. over 1 hour and stirred at that temperature for a further 3.5 hours to furnish 2,2-bis(3,5-diallyl-4-(3-methacryloyloxy)-2-hydroxypropoxy)phenyl)propane, i.e., the compound of formula $$CH_2=CHCH_2 \quad CH_2CH=CH_2$$
$$CH_2=C(CH_3)COOCH_2CH(OH)CH_2O-\text{Ar}-C(CH_3)_2-\text{Ar}-OCH_2CH(OH)CH_2OOC(CH_3)=CH_2$$
$$CH_2=CHCH_2 \quad CH_2CH=CH_2$$

(L)

This compound (50 g) was esterified with succinic anhydride (11.9 g) as described in Example 1. The resultant ester consisting predominantly of 2,3-bis(3,5-diallyl-4-(3-(methacryloyloxy)-2-(2-carboxyethylcarbonyloxy)propoxy)phenyl)propane, blended with pentaerythritol tetrathioglycollate (1 mercaptan group equiv. per allyl group equiv.), could be photopolymerised as described in Example 1.

EXAMPLE 9

A mixture (85 g) of 1,3-diallyl-2,4-dihydroxybenzene and 1,5-diallyl-2,4-dihydroxybenzene, prepared by a Claisen rearrangement carried out on resorcinol diallyl ether, was heated for 1 hour at 100° C. with 127 g of glycidyl methacrylate, 0.8 g of 2,6-di-tert.butyl-p-cresol, and 0.4 g of tetramethylammonium chloride, and the whole was stirred at that temperature for a further 5 hours to yield a mixture of 1,3- and 1,5-diallyl-2,4-bis(3-(methacryloyloxy)-2-hydroxypropoxy)benzene, i.e., the compounds of formulae (LI)

(IL)

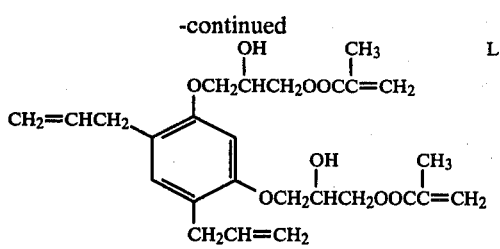

This mixture (50 g) was esterified with succinic anhydride (16.8 g) as described in Example 1. A blend of the resultant ester mixture, consisting predominantly of 1,3-diallyl-2,4-bis(3-(methacryloyloxy)-2-(2-carboxyethoxycarbonyl)propoxy)benzene and its 1,5-diallyl isomer, with pentaerythritol tetrathioglycollate (1 mercaptan group equiv. per allyl group equiv.) could be photopolymerised as described in Example 1.

EXAMPLE 10

1,3-Diglycidyl-5,5-dimethylhydantoin (100 g) was advanced by heating with 94.75 g of 2,2-bis(3-allyl-4-hydroxyphenyl)propane in 195 g of cyclohexanone containing 0.6 g of tetramethylammonium chloride for 6 hours at 120° C. The epoxide content of the mixture fell at the end of the 6 hours to 1.0 equiv./kg. The intermediate is substantially of formula LIII, where $R^{31}$ and $R^{32}$ each denote a glycidyl group and x is a positive integer. After the mixture had been cooled to 80° C., 0.4 g of 2,6-di-tert.butyl-p-cresol was added, followed by, dropwise over 20 minutes, 17.2 g of methacrylic acid. The mixture was then heated at 100° C. for 6 hours, reaction being halted at this stage, when the epoxide content of the resin had fallen to 0.29 equiv./kg. The product is substantially a mixture of the formula These diallyl esters (450 g) were dissolved in 1200 g of epichlorohydrin, the mixture was heated to 95° C., a solution of 2.05 g of tetramethylammonium chloride in 2.05 ml of water was added, and the whole was stirred at 95° C. for 3 hours. The mixture was cooled to 55°–60° C., and a further quantity of tetramethylammonium chloride (1.71 g) dissolved in 1.71 ml of water was added. Under a partial vacuum the mixture was brought to reflux at 55°–57° C. in an apparatus providing for continual removal of water from the water. A 50% aqueous solution (180 g) of sodium hydroxide was added dropwise with stirring over 2½ hours, then stirring was continued for a further 1½ hours. The mixture was cooled, the vacuum was released, then water (340 ml) was added, the mixture was separated, and the organic layer was washed, first with a 5% aqueous solution (223 ml) of sodium dihydrogen orthophosphate and then with 223 ml of water. The excess of epichlorohydrin was distilled off under reduced pressure to leave 450 g of benzophenone-3,4,3',4'-tetracarboxylic acid X,X'-diallyl esters Y,Y'-diglycidyl esters as a viscous oil having an epoxide content of 3.1 equiv./kg.

The diallyl esters-diglycidyl esters (200 g) were heated to 120° C. in the presence of 0.6 g of tetramethylammonium chloride and 0.4 g of 2,6-di-tert.butyl-p-cresol, and methacrylic acid (52.6 g) was added dropwise over 35 minutes. Stirring was continued for a further 35 minutes and then the mixture was allowed to cool.

The desired product, benzophenone-3,4,3',4'-tetracarboxylic acid X,X'-diallyl esters Y,Y'-bis(3-(methacryloyloxy)-2-hydroxypropyl) esters, (i.e., that of formula XXI, where one of $R^9$ and $R^{10}$, and one of $R^{11}$ and $R^{12}$, each denote an allyl group and each of the two remaining symbols of $R^9$ to $R^{12}$ denotes a group of

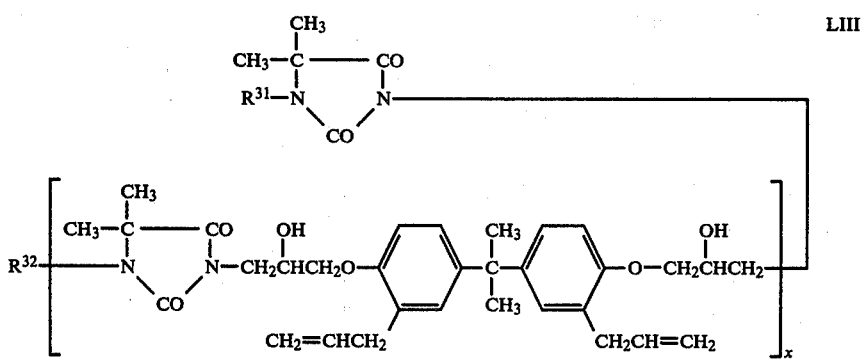

where a proportion of the groups $R^{31}$ and $R^{32}$ indicate 3-(methacryloyloxy)-2-hydroxypropyl groups and the remainder of them indicate glycidyl groups.

The mixture (50 g) was esterified with succinic anhydride (10 g) as described in Example 1. A blend of the resultant esterified mixture with pentaerythritol tetrathioglycollate (1 mercaptan group equiv. per allyl group equiv.) could be photopolymerised as described in Example 1.

EXAMPLE 11

Benzophenone-3,4,3',4'-tetracarboxylic acid dianhydride (400 g; recrystallised from acetic anhydride) and 1200 g of allyl alcohol were refluxed for 1 hour, then the excess of allyl alcohol was removed by vacuum distillation to leave 540 g of benzophenone-3,4,3',4'-tetracarboxylic acid X,X'-diallyl esters.

formula XXII, where $R^5$ represents a methyl group and $R^2$ a group of formula I where R denotes a hydrogen atom) was a light yellow, viscous oil.

This product (50 g) was esterified with succinic anhydride (11 g) as described in Example 1. A blend of the resultant ester, consisting predominantly of benzophenone-3,4,3',4'-tetracarboxylic acid X,X'-diallyl esters Y,Y'-bis(3-(methacryloyloxy)-2-(2-carboxyethoxycarbonyl)propyl esters, with pentaerythritol tetrathioglycollate (1 mercaptan group equiv. per allyl group equiv.) could be photopolymerised as described in Example 1, but omitting the benzil dimethyl ketal.

EXAMPLE 12

1,3-Diglycidyl-5,5-dimethylhydantoin (50 g) and 2,6-di-tert.butyl-p-cresol (0.14 g) were mixed and heated to 100° C. The mixture was treated over 1 hour with methacrylic acid (35.5 g) containing a 5% solution of chromium octanoate in light petroleum (0.05 g), and 2,6-di-tert.butyl-p-cresol (0.2 g).

This mixture was heated at 100° C. for 5 hours, and then treated with methacrylic acid (4.5 g) containing 2,6-di-tert.butyl-p-cresol (0.05 g). Heating was continued for a further 2½ hours and then a further quantity of methacrylic acid (2.2 g) and 2,6-di-tert.butyl-p-cresol (0.02 g) was added. The mixture was heated at 100° C. for 2 hours and methacrylic acid (1.5 g) and 2,6-di-tert-.butyl-p-cresol (0.2 g) were added. The mixture was heated at 100° C. for a further ¾ hour. The epoxide content of this product was found to be 0.14 equiv./kg.

4-(N,N-Diallylamino)phthalic anhydride (86.3 g; prepared in accordance with Example 2 of British Patent Specification No. 1,563,577) was added to the above mixture over 1 hour, stirred for a further hour at 100° C., then cooled to room temperature.

This product, viz., 1,3-bis(3-(methacryloyloxy)-2-(2-carboxy-4- and 5-diallylaminophenylcarbonyloxy)-propyl)-5,5-dimethylhydantoin, (8 g) was mixed with trimethylolpropane trithioglycollate (4 g, i.e., 0.9 mercaptan group equiv. per allyl equiv.), and 2,2'-azobis(2-methylpropionitrile) (0.4 g). The mixture was applied to a piece of tin plate as a coating 10 μm in thickness, and heated to 120° C. for 20 minutes. The coating cured to a hard, tack-free surface.

What is claimed is:
1. A polymerizable composition comprising
(a) a compound containing in the molecule
  (i) at least one group selected from acryloyloxy and methacryloyloxy groups,
  (ii) at least one group selected from allyl, methallyl, and 1-propenyl groups each of which is attached, either directly or through an oxygen atom or an oxycarbonyl group (—OCO—), to a carbon atom which forms part of an aromatic or cycloaliphatic nucleus, and
  (iii) at least one carboxylic acid (—COOH) group,
(b) a compound containing, per molecule, at least two mercaptan groups directly attached to an aliphatic carbon atom or atoms, in a proportion as to supply at least 0.8 such mercaptan group per group selected from allyl, methallyl and 1-propenyl groups in (a) but less than 1.0 such mercaptan group per group selected from acryloyl, methacryloyl, allyl, methallyl, and 1-propenyl groups in (a).

2. A composition of claim 1 in which the total of the groups (i) and (ii) in (a) is at least three.

3. A composition of claim 1 in which the or each said acryloyloxy or methacryloyloxy group is attached to an aromatic, cycloaliphatic, or heterocyclic nucleus through a group of formula

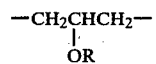

where R denotes either a hydrogen atom or a monovalent acyl residue of an at least dicarboxylic acid.

4. A composition of claim 3 wherein R in formula I is further of formula $$—CO—R^1—COOH \qquad II$$

where $R^1$ denotes an alkylene, arylene, or aralkylene group, any of which groups may be substituted by one or more allyl, methallyl, or 1-propenyl groups or by one or more carboxylic acid groups, the said alkylene group and the alkylene portion of the aralkylene group having from 2 to 10 carbon atoms, and the said arylene group and the arylene portion of the aralkylene group having from 6 to 10 carbon atoms.

5. A composition of claim 1, in which component (a) is a polyhydric phenol, at least two phenolic hydroxyl groups of which are esterified with acryloyl or methacryloyl groups through a carboxylic acid-containing group of formula

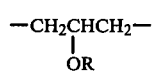

where R denotes a monovalent acyl radical of an at least dicarboxylic acid,
and at least two phenolic hydroxyl groups of which are directly etherified with groups chosen from allyl, methallyl, and 1-propenyl groups.

6. A composition of claim 1 in which component (a) is a polyhydric phenol, at least two phenolic hydroxyl groups of which are esterified with groups chosen from acryloyl and methacryloyl groups through a carboxylic acid-containing group of formula

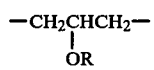

where R denotes a monovalent acyl radical of an at least dicarboxylic acid,
the polyhydric phenol being substituted directly on carbon atoms in one or more benzene or naphthalene nucleus or nuclei by at least two groups selected from allyl, methallyl, and 1-propenyl groups.

7. A composition of claim 1 wherein component (b) is an ester of a monomercaptanalkylenecarboxylic acid with a polyhydric alcohol or of an aliphatic monomercaptanmonohydric alcohol with a polycarboxylic acid.

* * * * *